(12) United States Patent
Choi et al.

(10) Patent No.: US 12,394,704 B1
(45) Date of Patent: Aug. 19, 2025

(54) SEMICONDUCTOR DEVICE INCLUDING INTERCONNECT STRUCTURE WITH METAL BRIDGE PATTERN CONNECTING ADJACENT METAL LINES

(71) Applicant: SAMSUNG ELECTRONICS CO., LTD., Suwon-si (KR)

(72) Inventors: Jaemyung Choi, Niskayuna, NY (US); Johnsoo Kim, Clifton Park, NY (US); Joongsuk Oh, Watervliet, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/948,080

(22) Filed: Nov. 14, 2024

Related U.S. Application Data (60) Provisional application No. 63/645,685, filed on May 10, 2024.

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |

(52) U.S. Cl.
CPC .... *H01L 23/5221* (2013.01); *H01L 21/76838* (2013.01); *H01L 23/5226* (2013.01); *H01L 23/528* (2013.01); *H01L 23/53242* (2013.01)

(58) Field of Classification Search
CPC .......... H01L 23/5226; H01L 21/31144; H01L 21/76802; H01L 23/53295; H10D 84/0149; H10D 89/10; H10D 84/0186
See application file for complete search history.

(56) References Cited

U.S. PATENT DOCUMENTS

| | | | |
|---|---|---|---|
| 9,024,418 B2 | 5/2015 | Zhu et al. | |
| 9,355,910 B2* | 5/2016 | Rashed | H01L 21/28518 |
| 9,779,943 B2 | 10/2017 | Bouche et al. | |
| 10,325,848 B2 | 6/2019 | Greene et al. | |
| 11,854,882 B2 | 12/2023 | Lin et al. | |
| 2016/0300826 A1* | 10/2016 | Lee | H01L 23/528 |
| 2017/0098641 A1* | 4/2017 | Jung | H10D 62/115 |
| 2019/0088591 A1 | 3/2019 | Hiremath et al. | |
| 2021/0335787 A1* | 10/2021 | Huang | H10D 84/853 |
| 2022/0352113 A1* | 11/2022 | Yao | H01L 21/76877 |
| 2024/0355633 A1* | 10/2024 | Chen | H01L 21/30604 |

* cited by examiner

*Primary Examiner* — Jaehwan Oh
(74) *Attorney, Agent, or Firm* — Sughrue Mion, PLLC (57) ABSTRACT

Provided is a semiconductor device which includes: a base layer; a $1^{st}$ metal line and a $2^{nd}$ metal extended in a $1^{st}$ direction and arranged in a $2^{nd}$ direction, intersecting the $1^{st}$ direction, in a $1^{st}$ layer above the base layer; and a bridge metal pattern extended in the $2^{nd}$ direction to connect the $1^{st}$ metal line and the $2^{nd}$ metal line in a $2^{nd}$ layer immediately above the $1^{st}$ layer.

20 Claims, 10 Drawing Sheets

295
SEMICONDUCTOR DEVICE INCLUDING INTERCONNECT STRUCTURE WITH METAL BRIDGE PATTERN CONNECTING ADJACENT METAL LINES

CROSS-REFERENCE TO RELATED APPLICATIONS

This application is based on and claims priority from U.S. Provisional Application No. 63/645,685 filed on May 10, 2024 in the U.S. Patent and Trademark Office, the disclosure of which is incorporated herein in its entirety by reference.

BACKGROUND

1. Field

Apparatuses and methods consistent with embodiments of the disclosure relate to a semiconductor device including an interconnect structure in which a metal jump structure is formed between adjacent two metal lines.

2. Description of the Related Art

Performance of a semiconductor device is affected by how an interconnect structure is formed in the semiconductor device. The interconnect structure includes back-end-of-line (BEOL) structures such as metal lines and vias which connect front-end-of-line (FEOL) structures to a voltage source or other circuit elements through middle-of-line (MOL) structures. The FEOL structures include transistor structures such as a channel structure, source/drain regions, and a gate structure, and the MOL structures include contact plugs formed on the source/drain regions and the gate structures.

As semiconductor devices are developed to have a high device density and performance, design and formation of an interconnect structure including metal lines and vias in a critical pitch area become more difficult and complicated while improved resistance and capacitance (RC) characteristics are required for the semiconductor device.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides example embodiments of an interconnect structure of a semiconductor device in which adjacent metal lines at a same metal layer are connected through a bridge metal pattern in an immediate upper layer without using an overlying metal line or via.

According to one or more embodiments, there is provided a semiconductor device which may include: a base layer; a $1^{st}$ metal line and a $2^{nd}$ metal extended in a $1^{st}$ direction and arranged in a $2^{nd}$ direction, intersecting the $1^{st}$ direction, in a $1^{st}$ layer above the base layer; and a bridge metal pattern extended in the $2^{nd}$ direction to connect the $1^{st}$ metal line and the $2^{nd}$ metal line in a $2^{nd}$ layer immediately above the $1^{st}$ layer.

According to one or more embodiments, there is provided a semiconductor device which may include: a base layer; a $1^{st}$ metal line, a $2^{nd}$ metal line, and a $3^{rd}$ metal line which are extended in a $1^{st}$ direction and arranged in a $2^{nd}$ direction, intersecting the $1^{st}$ direction, in a $1^{st}$ layer above the base layer, the $1^{st}$ metal line being adjacent to the $2^{nd}$ metal line; a via on the $3^{rd}$ metal line in a $2^{nd}$ layer immediately above the $1^{st}$ layer; and a bridge metal pattern connecting the $1^{st}$ metal line and the $2^{nd}$ metal line in the $2^{nd}$ layer.

According to one or more embodiments, there is provided a method of manufacturing a semiconductor device. The method may include: providing a base layer; forming a $1^{st}$ metal line and a $2^{nd}$ metal line to be extended in a $1^{st}$ direction and arranged in a $2^{nd}$ direction, intersecting the $1^{st}$ direction, in a $1^{st}$ layer above the base layer; and forming a bridge metal pattern to be extended in the $2^{nd}$ direction and connect the $1^{st}$ metal line and the $2^{nd}$ metal line in a $2^{nd}$ layer immediately above the $1^{st}$ layer.

BRIEF DESCRIPTION OF DRAWINGS

Example embodiments of the disclosure will be more clearly understood from the following detailed description taken in conjunction with the accompanying drawings as follows.

DETAILED DESCRIPTION

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$" etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Herein, a term "isolation" may refer to electrical isolation or insulation.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements of a semiconductor device may or may not be described in detail herein or shown in the drawings. For example, MOL or FEOL structures may not be shown or described in detail when these structures are not relevant to the concept of the disclosure.

Herebelow, various embodiments of the disclosure are described in reference to the accompanying drawings.

Figure 1:
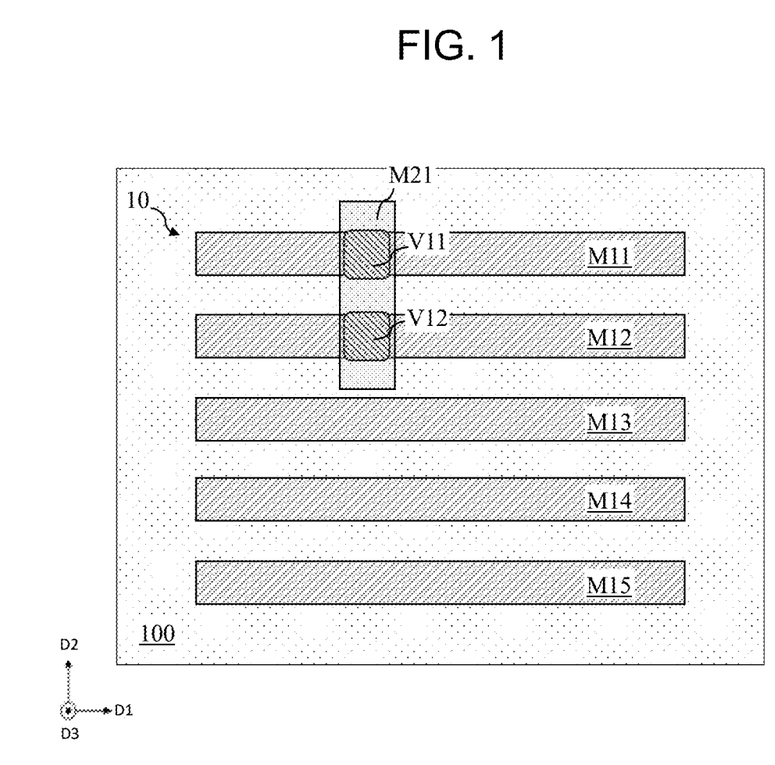
FIG. 1 illustrates a plan view of semiconductor device including an interconnect structure.

FIG. 1 illustrates a plan view of semiconductor device including an interconnect structure.

Referring to FIG. 1, an interconnect structure 10 formed in a BEOL process may be disposed on a base layer 100. Here, the base layer 100 may be a BEOL layer including another interconnect structure, a middle-of-line (MOL) layer including one or more contact structures, or a front-end-of-line (FEOL) layer including one or more active devices (e.g., transistor structure) or passive devices (e.g., capacitor) of a semiconductor device.

The interconnect structure 10 may include a plurality of M1 metal lines M11-M15, a plurality of vias V11 and V12 formed on the M1 metal lines M11 and M12, and an M2 metal line M21 connecting the M1 metal lines M11 and M12 through the vias V11 and V12. The M1 metal lines may be formed to be extended in a $1^{st}$ direction D1 and arranged at a predetermined pitch in a $2^{nd}$ direction D2 perpendicular to the $1^{st}$ direction D1. The M1 metal lines may be formed at a same level, for example, at an M1 level (or M1 metal layer). Thus, bottom surfaces of the M1 metal lines may be horizontally coplanar or aligned, and top surfaces thereof may also be horizontally coplanar or aligned, in the $1^{st}$ direction D1 and the $2^{nd}$ direction. The M1 and M2 metal lines and the vias V11 and V12 may be formed of a metal or metal compound including ruthenium (Ru), molybdenum (Mo), etc., not being limited to, which can be formed through not a damascene process but direct etching on an initial metal structure formed of the same metal or metal compound.

When there is a design requirement for connecting the M1 metal lines M11 and

M12 adjacent to each other in the $2^{nd}$ direction D2, the current design/manufacturing scheme for metal lines does not allow a direct connection of the two M1 metal lines in the $2^{nd}$ direction D2 if the M1 metal lines are formed in a very high-density area or a critical minimum metal-pitch area through a self-aligned method using spacers defining a metal-to-metal distance. Thus, the two M1 metal lines may be connected at an upper level, for example, an M2 or M3 level (or M2 or M3 metal layer), through two or more vias at one or more via layers. However, a minimum via-to-via distance limitation in the critical minimum metal-pitch area also does not allow the two vias V11 and V12 formed at a same level to be arranged in the $2^{nd}$ direction D2 and connected to each other through an overlying M2 metal line as shown in FIG. 1.

Figure 2:
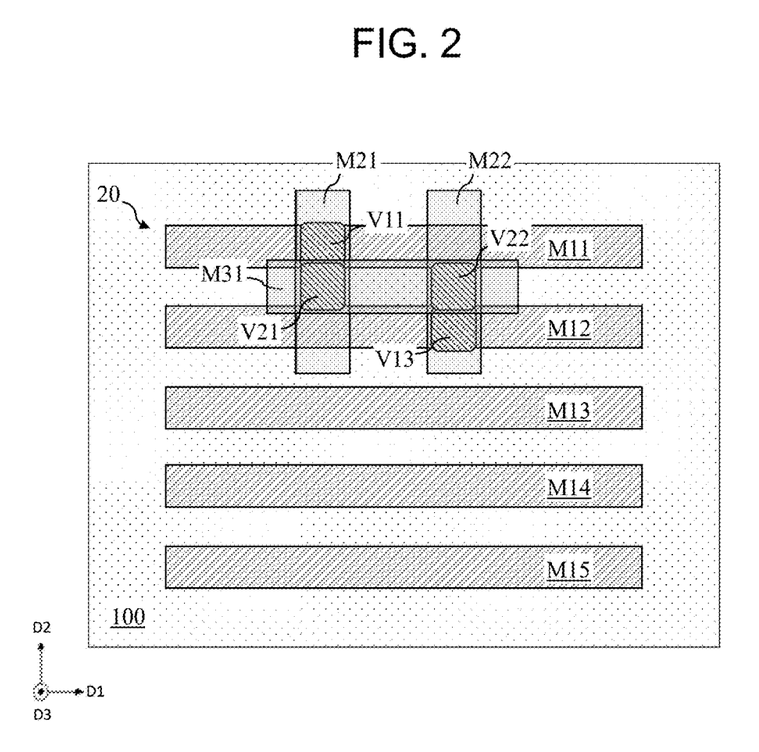
FIGS. 2 and 3 illustrate plan views of semiconductor devices each including an interconnect structure, according to some embodiments.
Figure 3:
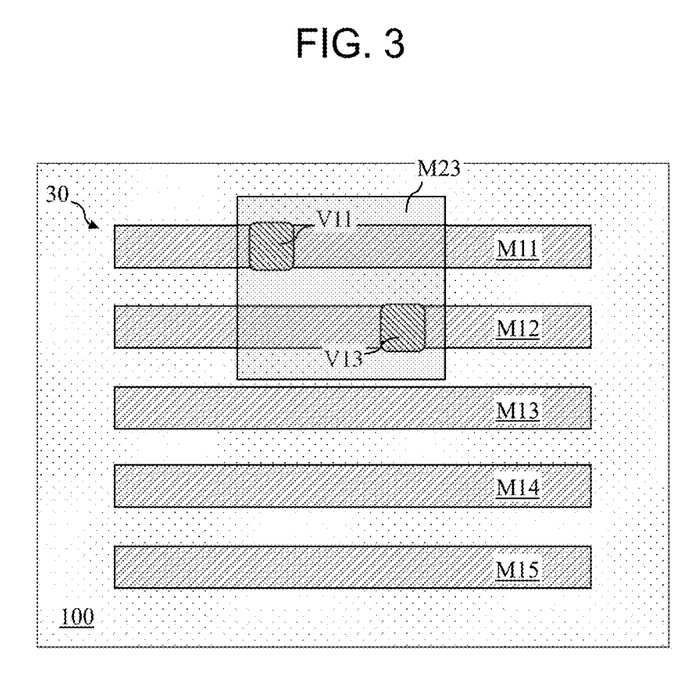

Thus, the M1 metal lines M11 and M12 may be connected using two vias which are not arranged in the $2^{nd}$ direction D2, and instead, horizontally offset from each other on the two M1 metal lines M11 and M12, respectively, as shown in FIGS. 2 and 3.

FIGS. 2 and 3 illustrate plan views of semiconductor devices each including an interconnect structure, according to some embodiments.

Referring to FIG. 2, an interconnect structure 20 may include the base layer 100, the M1 metal lines M11-M15, the via V11, and the M2 metal line M21 which may be the same as those of the interconnect structure 10 shown in FIG. 1, and thus, duplicate descriptions thereof may be omitted herein.

In the interconnect structure 20, the M1 metal lines M11 and M12 may be connected through two horizontally-offset vias V11 and V13, two adjacent M2 metal lines M21 and M22, two vias V21 and V22, and an M3 metal line M31. These metal lines and vias may have the same material composition as those of the interconnect structure 10.

The vias V11 and V13 are formed in a $1^{st}$ via layer on the M1 metal lines M11 and M12, respectively. The M2 metal lines M21 and M22 respectively formed at the same M2 level (or M2 metal layer) on the vias V11 and V13 may be extended in the $2^{nd}$ direction D2 and arranged in the $1^{st}$ direction D1. The two vias V21 and V22 may be formed in a $2^{nd}$ via layer on the two M2 metal lines M21 and M22, respectively. The M3 metal line M31 may be formed at an M3 level (or M3 metal layer) on the $2^{nd}$ via layer to connect these two vias V21 and V22 by being extended in the $1^{st}$ direction D1.

Here, the connection of the two metal lines M11 and M12 in the critical minimum metal-pitch area requires a number of additional interconnects including the vias V11, V13, V21 and V22, the M2 metal lines M21 and M22, and the M3 metal line M31 at for upper levels (two metal layers and two via layers). Thus, formation of the interconnect structure 20 for a semiconductor device may become complicated and cause area penalties for a semiconductor device including the interconnect structure 20. Accordingly, another interconnect structure scheme may be considered as below.

Referring to FIG. 3, an interconnect structure 30 may include the base layer 100, the M1 metal lines M11-M15, and the vias V11 and V13, which may be the same as those of the interconnect structure 20 shown in FIG. 2, and thus, duplicate descriptions thereof may be omitted herein.

In the interconnect structure 30, the M1 metal lines M11 and M12 may be connected through two horizontally-offset vias V11 and V13 in the $1^{st}$ via layer and a single wide M2 metal line M23 at the M2 level (M2 metal layer) extended both in the $1^{st}$ direction D1 and the $2^{nd}$ direction D2 to cover both vias V11 and V13. However, in addition to using two more layers (one metal layer and one via layer), the wide area of the M2 metal line M23 prevents formation of other circuit elements or other metal lines or vias in that space occupied by the M2 metal line M23, which also causes an unnecessary area penalty in the critical minimum metal-pitch area.

The following embodiments may address the foregoing problems of the interconnect structures 20 and 30 shown in FIGS. 2 and 3, respectively.

Figure 4A:
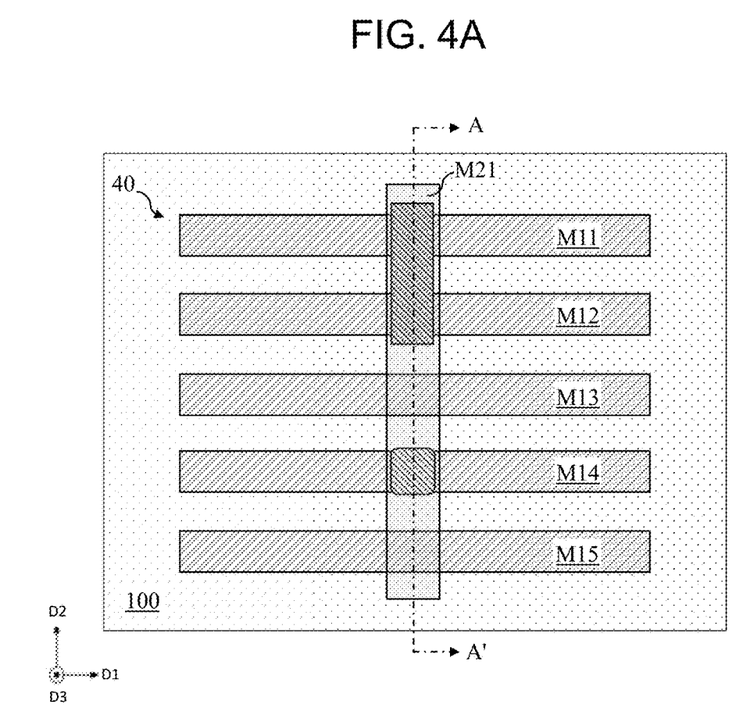
FIG. 4A illustrates a plan view of a semiconductor device including an interconnect structure with a bridge metal pattern, according one or more embodiments.
Figure 4B:
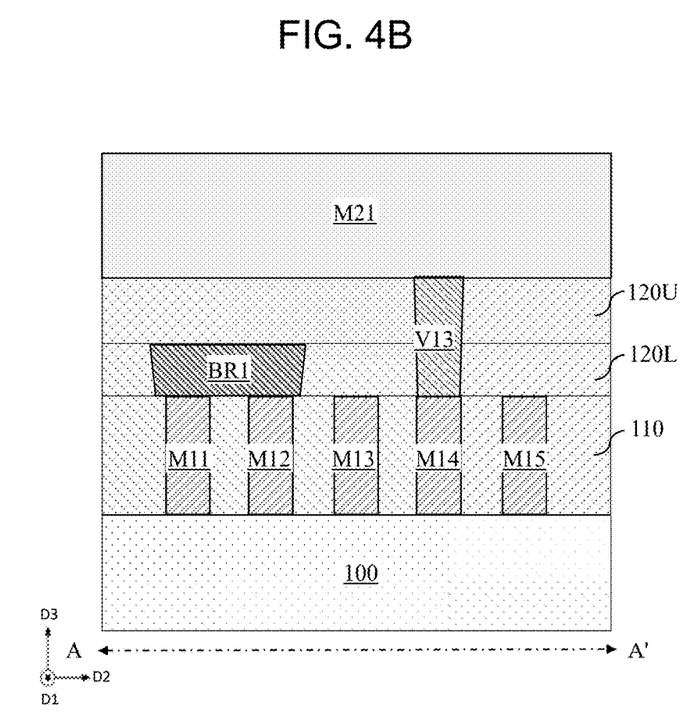
FIG. 4B illustrates a cross-section view of the semiconductor device of FIG. 4A taken along a line A-A' shown in FIG. 4A, according to one or more embodiments.

FIG. 4A illustrates a plan view of a semiconductor device including an interconnect structure with a bridge metal pattern, according one or more embodiments, and FIG. 4B illustrates a cross-section view of the semiconductor device of FIG. 4A taken along a line A-A' shown in FIG. 4A, according to one or more embodiments.

Referring to FIGS. 4A and 4B, an interconnect structure 40 may include the base layer 100 and the M1 metal lines M11-M15 in an M1 metal layer, which may be the same as those of the interconnect structures 20 and 30 shown in FIGS. 2 and 3, respectively, and thus, duplicate descriptions thereof may be omitted herein.

However, the interconnect structure 40 may include a bridge metal pattern BR1 which connects the two M1 metal lines M11 and M12 in a via layer where the via V13 is formed to connect the M1 metal line M14 to the M2 metal line M21 in an M2 metal layer. Here, it is to be understood that the via layer is an immediate upper layer or a vertically adjacent layer of the M1 metal layer, and thus, no other metal layer or via layer exists between the via layer and the M1 metal layer.

The bridge metal pattern BR1 may be formed such that a bottom surface thereof is vertically at a same level as top surfaces of the M1 metal lines M11 and M12. For example, the bottom surface of the bridge metal pattern BR1 may contact the top surfaces of the M1 metal lines M11 and M12, which may be a top surface of the M1 metal layer. Further, the bridge metal pattern BR1 may be formed such that a top surface thereof is at a level lower than a top surface of the via V13. For example, while the via V13 is formed to penetrate through an entire via layer consisting of a lower via layer and an upper via layer, the bridge metal pattern BR1 may be formed in the lower via layer. Moreover, the bridge metal pattern BR1 may have a smaller length than the M1 metal lines M11 and M12 in the $1^{st}$ direction D1 as shown in FIG. 4A.

While the $1^{st}$ metal layer includes a $1^{st}$ inter-metal dielectric (IMD) structure 110, the via layer may include two IMD structures, for example, a lower $2^{nd}$ IMD structure 120L forming the lower via layer and an upper $2^{nd}$ IMD structure 120U forming the upper via layer. The lower $2^{nd}$ IMD structure 120L may surround the bridge metal pattern BR1, for example, side surfaces thereof. In contrast, the via 13, for example, side surfaces thereof, may be surrounded by the lower $2^{nd}$ IMD structure 120L and the upper $2^{nd}$ IMD structure 120U. The IMD structures 110, 120L and 120U may each be formed of a low-k dielectric material such as silicon oxide ($SiO_2$), not being limited thereto. However, as these three IMD structures may be formed at different steps or operations, there may be formed a connection surface or interface which may be visible through cross-sectional transmission electron microscopy (TEM) or scanning electron microscopy (SEM). For example, even the lower $2^{nd}$ IMD structure 120L and the upper $2^{nd}$ IMD structure 120U may be formed at different steps, as will be described later in reference to FIGS. 5C-5D, and thus, these two IMD structures 120L and 120U are not a single continuum structure, and a visible connection surface or interface may be formed therebetween As the two M1 metal lines M11 and M12 are connected though the bridge metal pattern BR1 in the existing via layer where the via V13 is formed to connect the lower M1 metal line M14 and the upper M2 metal line M21, no additional upper or lower metal layer is required to connect the two adjacent M1 metal lines M11 and M12. Thus, a connection length is shortened, thereby reducing a contact resistance, and further, an area gain may be achieved. In addition, a manufacturing process of the interconnect structure 40 may be simplified compared to those of the interconnect structures 20 and 30.

The metal lines M11-M15, M21, the via V13, and the bridge metal pattern BR1 may be formed of the same metal or metal compound such as ruthenium (Ru), molybdenum (Mo), copper (Cu), tungsten (W), cobalt (Co), aluminum (Al), etc., not being limited thereto. However, the disclosure is not limited thereto. For example, the M1 metal lines M11-M15 may be formed of Ru, and the via V13, the M2 metal line and the bridge metal pattern BR1 may be formed of Cu.

A contact liner formed of titanium nitride (TiN) or equivalent may be formed between the bridge metal pattern BR1 and each of the M1 metal lines M11 and M12, between the via V13 and each of the M1 metal line M14 and the M2 metal line M2, or between the base layer 100 and each of the M1 metal lines M11-M15 to reduce a contact resistance and enhance adhesion properties between two connected metal structures through the contact liner. Thus, in a case where the contact liner is formed on the top surfaces of the M1 metal lines M11 and M12, the bottom surface of the bridge metal pattern BR1 may be at a level above the top surfaces of the M1 metal lines M11 and M12 by a thickness of the contact liner in the $3^{rd}$ direction D3.

Herebelow, a method of manufacturing a semiconductor device including an interconnect structure with a bridge metal pattern is provided.

FIGS. 5A-5F illustrate cross-section views of intermediate semiconductor devices after respective steps of manufacturing a semiconductor device including an interconnect structure in which a bridge metal pattern is formed to connect two adjacent metal lines in a same metal layer, according to one or more embodiments.

The semiconductor device manufactured in reference to FIGS. 5A-5F may be or correspond to the semiconductor device including the interconnect structure 40 shown in FIGS. 4A and 4B, and the cross-section view of each of the intermediate semiconductor devices shown in FIGS. 5A-5F corresponds to that shown in FIG. 4B. Thus, duplicate descriptions about the same structural elements described above in reference to FIGS. 4A and 4B may be omitted, and the same reference numerals and characters shown therein may be used in the description herebelow.

Figure 5A:
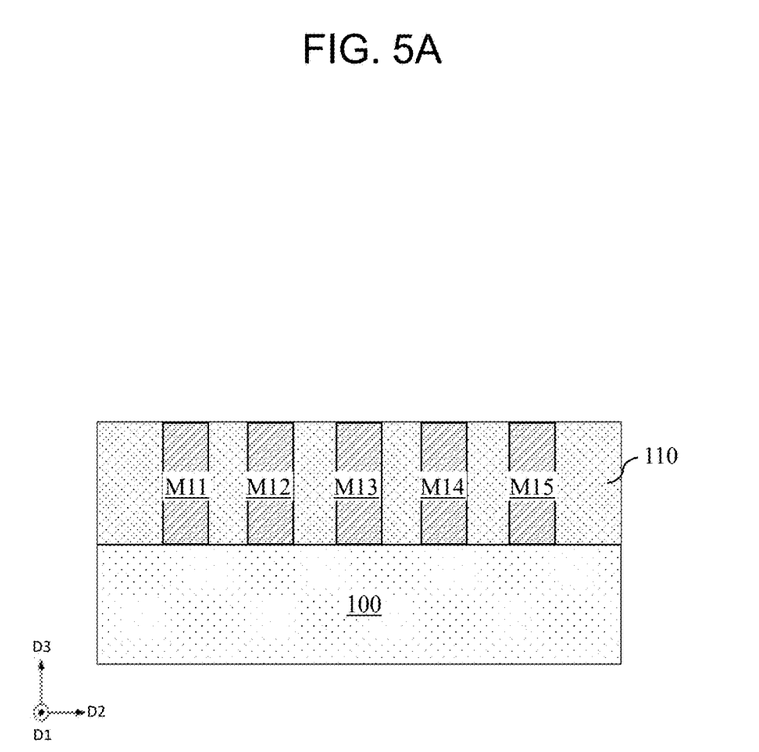
FIGS. 5A-5F illustrate cross-section views of intermediate semiconductor devices after respective steps of manufacturing a semiconductor device including an interconnect structure in which a bridge metal pattern is formed to connect two adjacent metal lines in a same metal layer, according to one or more embodiments.

Referring to FIG. 5A, an intermediate semiconductor device may include a plurality of M1 metal lines M11-M15 having a predetermined pitch on a base layer 100.

The M1 metal lines M11-M15 may be patterned out through direct etching on an initial metal structure based on hard mask patterns on a top surface of the initial metal structure. The direct etching may be performed from the top surface of the initial metal structure through, for example, dry etching such as reactive ion etching (RIE) to form the M1 metal lines M11-M15 in a $1^{st}$ M1 metal layer on the base layer 100. The initial metal structure forming the M1 metal lines may be ruthenium (Ru) which provides a lower resistance and a reduced electromigration property than other metal materials such as copper (Cu). Alternatively, molybdenum (Mo) or cobalt (Co) may form the initial metal structure for the M1 metal lines. However, the disclosure may not be limited thereto. According to one or more other embodiments, the M1 metal lines M11-M15 may be formed through a single damascene process on the $1^{st}$ IMID structure 110.

The M1 metal lines M11-M15 may be formed to be extended in the $1^{st}$ direction D1 and arranged in the $2^{nd}$ direction D2 with a predetermined pitch. Further, the M1 metal lines M11-M15 may be surrounded by a $1^{st}$ IMD structure 110. The $1^{st}$ IMD structure 110 may be formed to surround the M1 metal lines M11-M15 after formation of these M1 metal lines in a case where the M1 metal lines are Ru. Alternatively, the $1^{st}$ IMD structure 110 may be formed earlier than formation of the M1 metal lines in a case where the M1 metal lines are Cu or a Cu alloy.

Figure 5B:
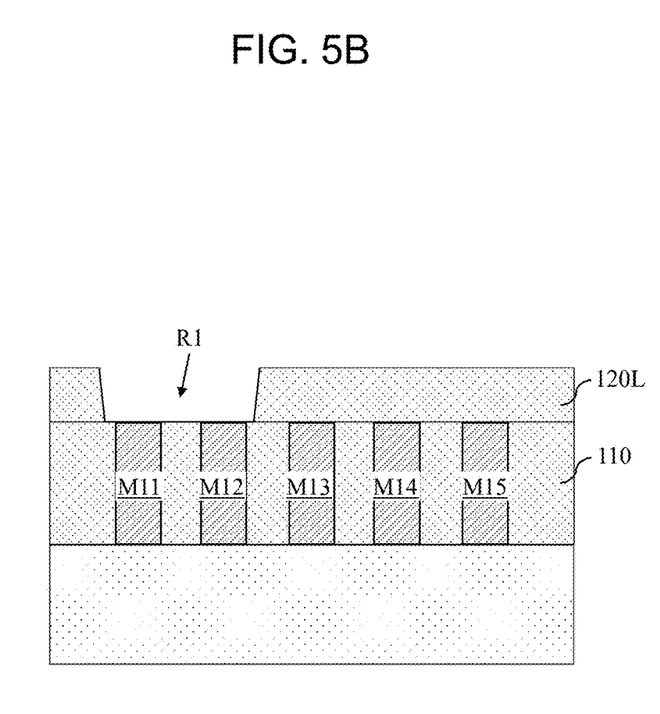

Referring to FIG. 5B, a lower $2^{nd}$ IMD structure 120L may be formed in a lower via layer above the M1 metal layer including the $1^{st}$ IMD structure 110, and patterned to form a $1^{st}$ recess R1 which exposes top surfaces of the M1 metal lines M11 and M12.

The formation of the lower $2^{nd}$ IMD structure may be performed through, for example, depositing a low-k dielectric material such as silicon oxide ($SiO_2$) on a top surface of the intermediate semiconductor device obtained in the previous step (FIG. 5A) using physical vapor deposition (PVD), chemical vapor deposition (CVD), plasma enhanced chemical vapor deposition (PECVD), atomic layer deposition (ALD), a combination thereof, etc., not being limited thereto, followed by planarization (e.g., chemical-mechanical polishing (CMP)) on top thereof.

The $1^{st}$ recess R1 may be formed through, for example, dry etching such as reactive ion etching (RIE) or wet etching using hydrofluoric acid (HF), not being limited thereto, until top surfaces of the M1 metal lines M11 and M12 are exposed.

Figure 5C:
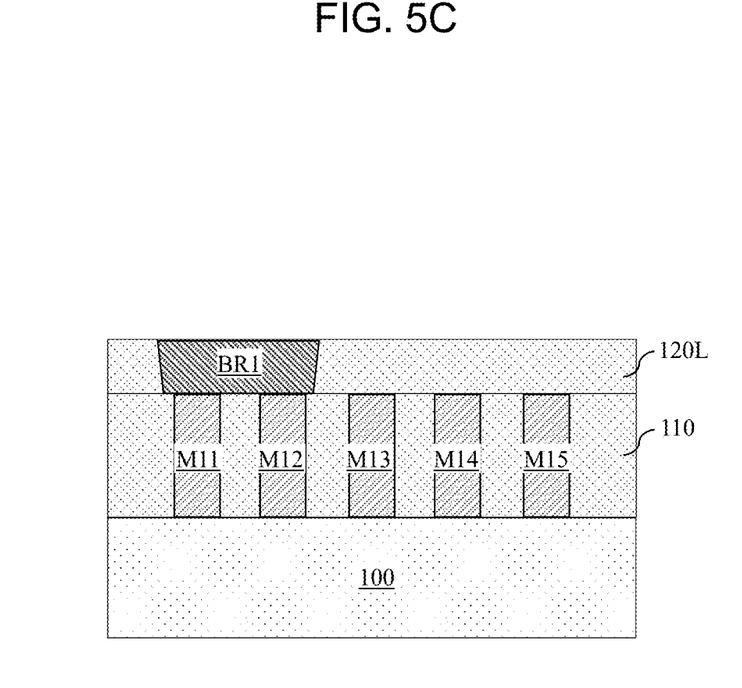

Referring to FIG. 5C, a bridge metal pattern BR1 may be formed in the recess R1.

The formation of the bridge metal pattern BR1 may be performed through, for example, depositing a metal or metal compound such as Cu using PVD. CVD, PECVD, ALD or a combination thereof, followed by planarization (e.g., CMP), not being limited thereto.

The bridge metal pattern BR1 may be formed such that a bottom surface thereof contacts the top surfaces of the M1 metal lines M11 and M12, and a top surface of the bridge metal pattern BR1 is horizontally coplanar or aligned with a top surface of the lower $2^{nd}$ IMD structure 120L.

Figure 5D:
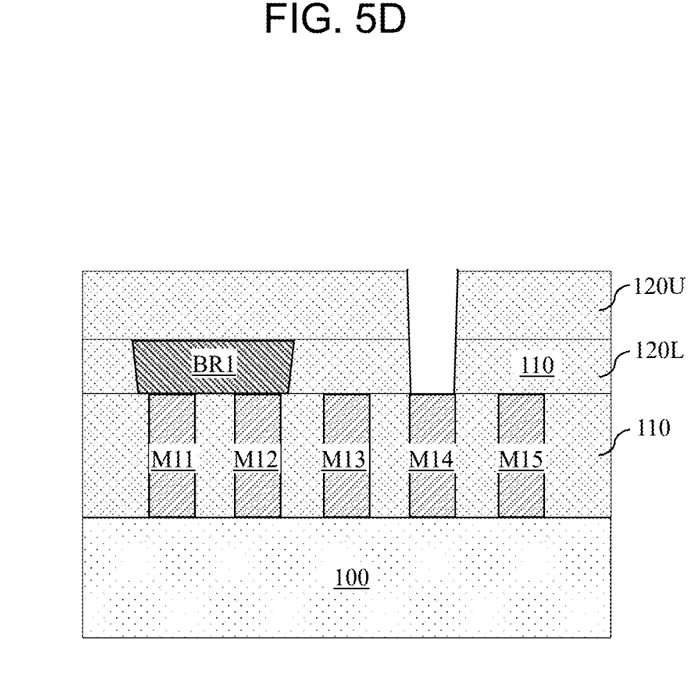

Referring to FIG. 5D, an upper $2^{nd}$ IMD structure 120U may be formed on the lower $2^{nd}$ IMD structure 120L, and the upper and lower $2^{nd}$ IMD structures 120U and 120L may be patterned in a $3^{rd}$ direction D3 intersecting the $1^{st}$ direction D1 and the $2^{nd}$ direction D2 such that a $2^{nd}$ recess R2 is formed to expose top surface of the M1 metal line M14.

The upper $2^{nd}$ IMD structure 120U may be formed for example, depositing a low-k dielectric material such as silicon oxide ($SiO_2$) on a top surface of the lower $2^{nd}$ IMD structure 120L using PVD, CVD, PECVD, ALD, a combination thereof, not being limited thereto, followed by planarization (e.g., CMP) on top thereof. The $2^{nd}$ recess R2 may be formed through, for example, dry etching such as RIE or wet etching using HF, not being limited thereto, until a top surface of the M1 metal line M14 is exposed.

The upper $2^{nd}$ IMD structure 120U may form an upper via layer while the lower $2^{nd}$ IMD structure 120L forms a lower via layer. The $2^{nd}$ recess R2 may be formed to penetrate through the upper $2^{nd}$ IMD structure 120U (upper via layer) and the lower $2^{nd}$ IMD structure 120L (lower via layer).

Figure 5E:
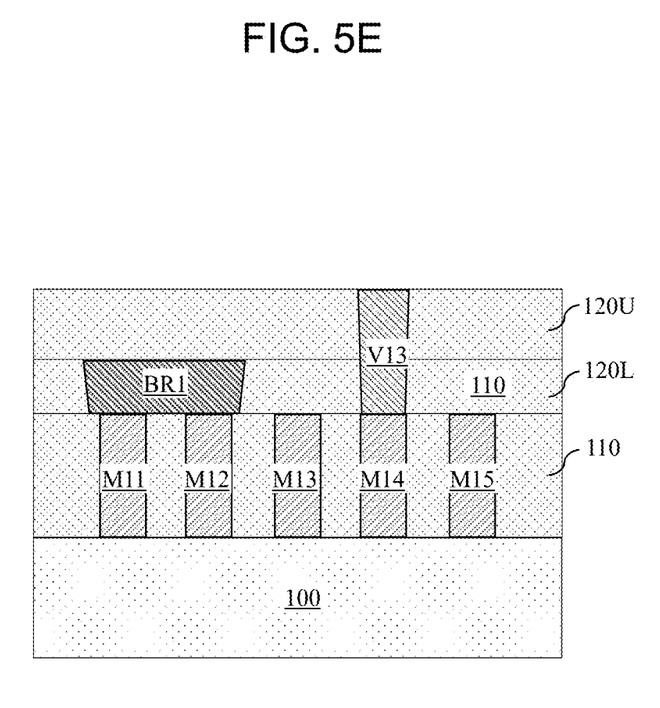

Referring to FIG. 5E, a via V13 may be formed in the $2^{nd}$ recess such that a bottom surface of the via V13 contacts the top surface of the M1 metal line M14.

The via V13 may be formed through, for example, depositing a metal or metal compound such as Cu using PVD. CVD, PECVD, ALD or a combination thereof, followed by planarization (e.g., CMP), not being limited thereto. The via V3 may be formed such that a bottom surface thereof contacts the top surface of the M1 metal line M14, and a top surface of the via V3 is horizontally coplanar or aligned with a top surface of the upper $2^{nd}$ IMD structure 120U.

Figure 5F:
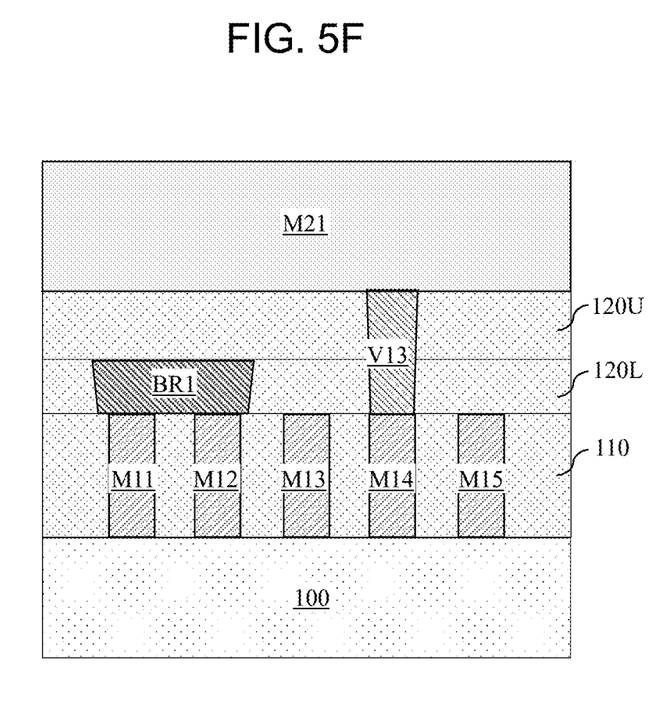

Referring to FIG. 5F, a $2^{nd}$ metal line M21 may be formed in an M2 metal layer to be connected to the via V13.

The $2^{nd}$ metal line M21 may be formed in a damascene process or direct etching, according to one or more embodiments. In a case where the $2^{nd}$ metal line M21 is to be formed of Ru, the direct etching process may be performed on an initial metal structure of Ru, and in a case where the $2^{nd}$ metal line M21 is to be formed of Cu, a damascene process may be performed.

In the above embodiments, the bridge metal pattern BR1 is formed in the lower via layer to contact the top surfaces of the M1 metal lines M11 and M12. However, the bridge metal pattern may be formed in a different manner as described in the following embodiments.

Figure 6A:
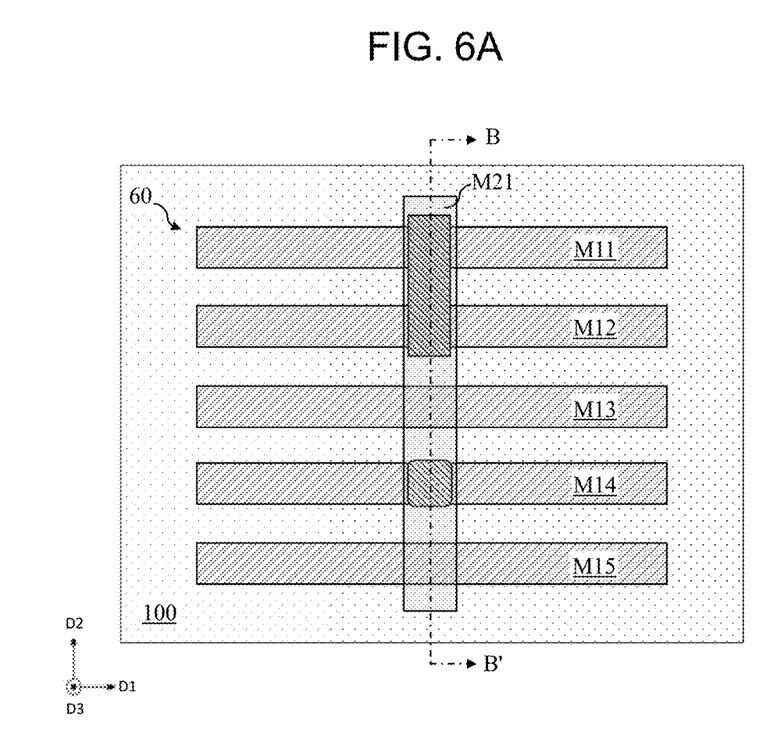
FIG. 6A illustrates a plan view of a semiconductor device including an interconnect structure with a bridge metal pattern, according one or more other embodiments.
Figure 6B:
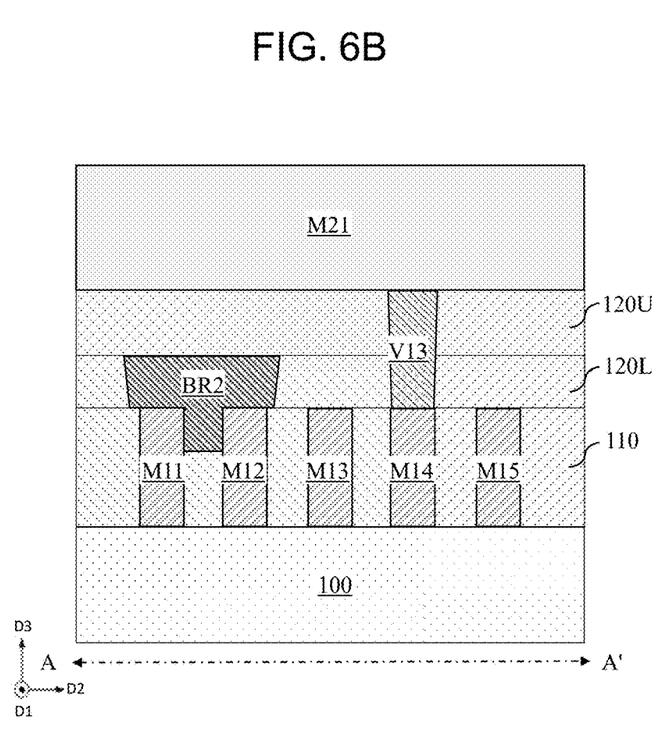
FIG. 6B illustrates a cross-section view of the semiconductor device of FIG. 6A taken along a line B-B' shown in FIG. 6A, according to one or more embodiments.

FIG. 6A illustrates a plan view of a semiconductor device including an interconnect structure with a bridge metal pattern, according one or more other embodiments, and FIG. 6B illustrates a cross-section view of the semiconductor device of FIG. 6A taken along a line B-B' shown in FIG. 6A, according to one or more embodiments.

Referring to FIGS. 6A and 6B, an interconnect structure 60 may include the same structural elements as those of the interconnect structure 40 shown in FIGS. 4A and 4B except a bridge metal pattern BR2. Thus, while duplicate descriptions thereof are omitted herein, different aspects of the interconnect structure 60 may be described hereinbelow.

Unlike the bridge metal pattern BR1 formed only in the lower via layer of the interconnect structure 40 as shown in FIGS. 4A and 4B, the bridge metal pattern BR2 may be formed across the M1 metal layer ($1^{st}$ IMD structure 110) and the lower via layer (lower $2^{nd}$ IMD structure 120L) in the interconnect structure 60. For example, a portion of the bridge metal pattern BR2 in the interconnect structure 60 has the same shape as the entire bridge metal pattern BR1 in the interconnect structure 40, an additional portion of the bridge metal pattern BR2 is formed between upper side surface of the M1 metal lines M11 and M12 facing each other in the $2^{nd}$ direction D2 to connect these two upper side surfaces. However, a bottom side surface of the bridge metal pattern BR2, for example, a bottom surface of this additional portion, may still be at a level above bottom surfaces of the M1 metal lines M11 and M12.

Thus, the bridge metal pattern BR2 contacts not only the top surfaces of the M1 metal lines M11 and M12 but also upper side surfaces thereof facing each other in the $1^{st}$ IMD structure 110, so that a contact area of the bridge metal pattern BR2 is greater than that of the bridge metal pattern BR1 in the interconnect structure 40. Accordingly, a contact resistance may be further reduced in the interconnect structure 60 including the bridge metal pattern BR2 to connect the M1 metal lines M11 and M12.

Figure 7:
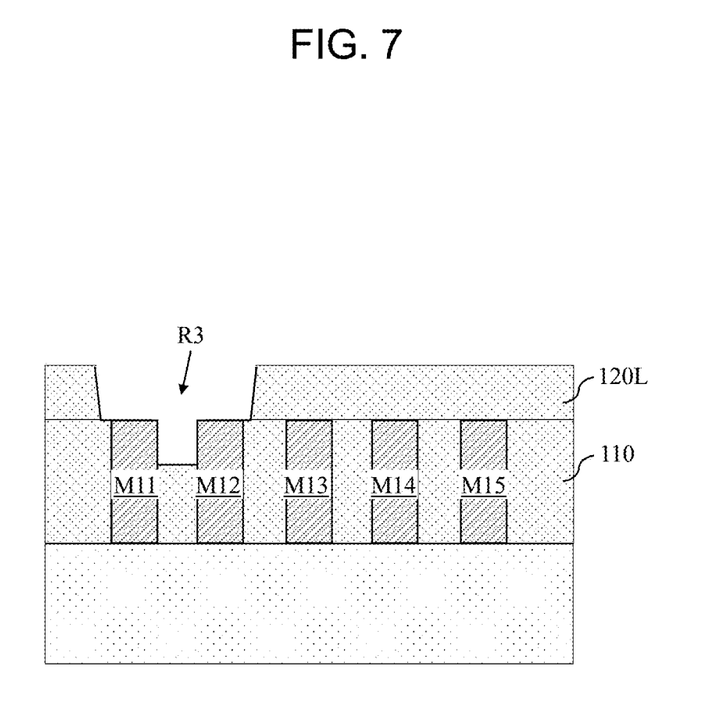
FIG. 7 illustrate a cross-section view of an intermediate semiconductor device corresponding to the intermediate semiconductor device shown in FIG. 5B, according to one or more embodiments.

The interconnect structure 60 including the bridge metal pattern BR2 may be formed through the same steps performed to form the interconnect structure 40 including the bridge metal pattern BR1, except that the $1^{st}$ recess R1 shown in FIG. 5B is further etched to form a $3^{rd}$ recess R3 that penetrates into the $1^{st}$ IMD structure 110 by a predetermined depth, as shown in FIG. 7. The bridge metal pattern BR2 may be formed in the $3^{rd}$ recess R3 to contact not only the top surfaces of the M1 metal lines M11 and M12 but also the upper side surfaces of the M1 metal lines M11 and M12 facing each other. The subsequent steps of forming the interconnect structure 60 may be the same, and thus, duplicate descriptions thereof may be omitted herein.

According to the above embodiments, the two adjacent M1 metal lines M11 and M12 in a critical minimum metal-pitch area may be connected without using an overlying or underlying metal line or via, thereby achieving a reduced contact resistance, an area gain, and manufacturing simplicity.

Figure 8:
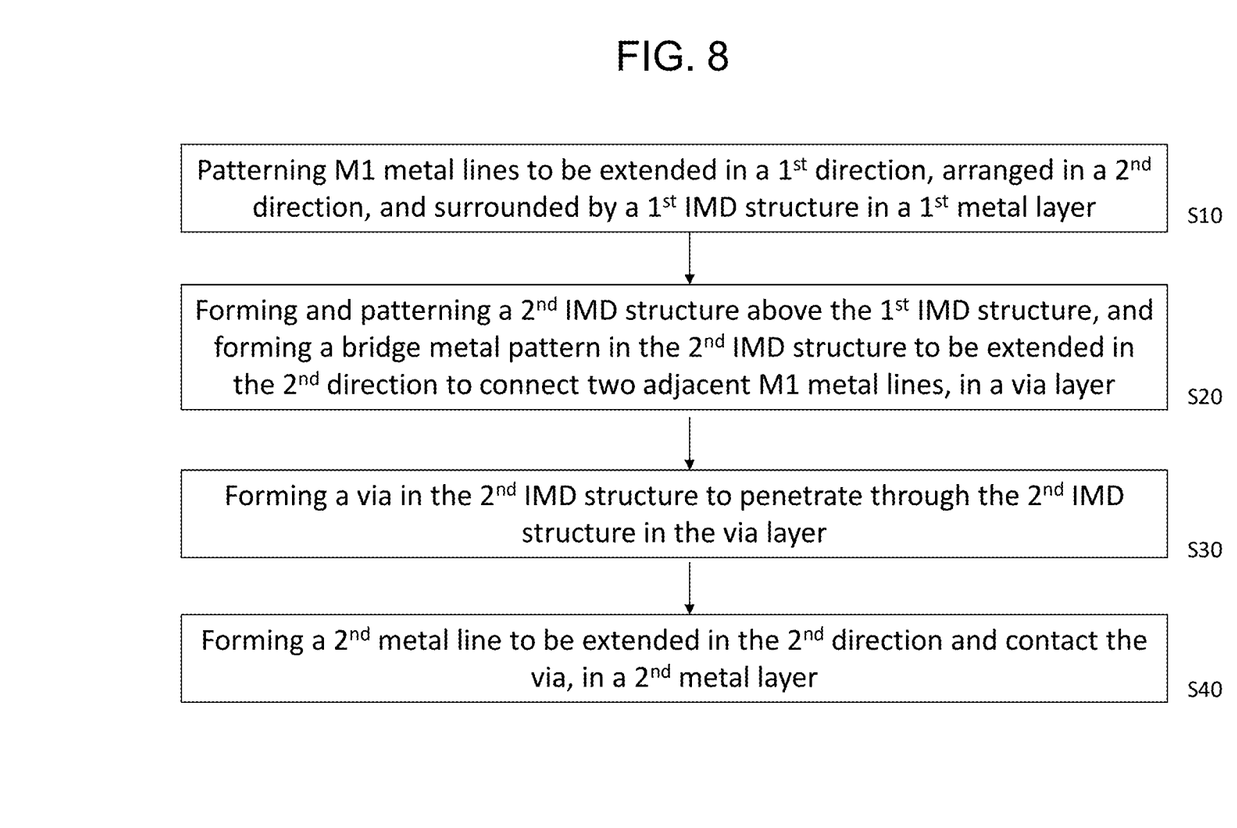
FIG. 8 illustrates a flowchart for a method of manufacturing a semiconductor device including an interconnect structure in which a bridge metal pattern is formed to connect two adjacent metal lines in a same metal layer, in reference to FIGS. 5A-5F and 7, according to one or more embodiments.

FIG. 8 illustrates a flowchart for a method of manufacturing a semiconductor device including an interconnect structure in which a bridge metal pattern is formed to connect two adjacent metal lines in a same metal layer, in reference to FIGS. 5A-5F and 7, according to one or more embodiments.

In step S10, a plurality of M1 metal lines may be patterned to be extended in a $1^{st}$ direction D1, arranged in a $2^{nd}$ direction D2, and surrounded by a $1^{st}$ IMD structure, in a $1^{st}$ metal layer on a base layer (FIG. 5A). The M1 metal lines may be formed in a critical minimum metal-pitch area which is a very high-density area in a semiconductor device. The M1 metal lines may be patterned from an initial metal structure of ruthenium (Ru).

In step S20, a $2^{nd}$ IMD structure may be formed above the $1^{st}$ IMID structure and patterned in a via layer, and a bridge metal pattern may be formed in the $2^{nd}$ IMD structure to be extended in the $2^{nd}$ direction to connect two adjacent M1 metal lines (FIGS. 5B-5C). The bridge metal pattern may be formed in a lower portion of the $2^{nd}$ IMD structure such that a top surface thereof is at a level below a top surface of the $2^{nd}$ IMD structure, and a bottom surface thereof contacts top surfaces of the two M1 metal lines. In addition, a portion of the bridge metal pattern protrudes into the $1^{st}$ IMD structure and contact side surfaces of the two M1 metal lines. The bridge metal pattern may be formed of a metal or metal compound suitable for a damascene process.

In step S30, a via may be formed in the $2^{nd}$ IMD structure to penetrate through the $2^{nd}$ IMD structure in the via layer (FIGS. 5D-5E). The via may be formed to penetrate through the $2^{nd}$ IMD structure, and a top surface of the via may be formed at a level above the top surface of the bridge metal pattern.

In step S40, a $2^{nd}$ metal line may be formed to be extended in the $2^{nd}$ direction and contact the via in a $2^{nd}$ metal layer (FIG. 5F). The $2^{nd}$ metal line may contact a top surface of the via.

The above embodiments provide an interconnect structure including five M1 metal lines M11-M15 at the M1 metal layer and a bridge metal pattern connecting two adjacent M1 metal lines M11 and M12 among the three M1 metal lines M11-M13. However, the disclosure is not limited thereto. The bridge metal pattern may be formed in an interconnect structure having more or less than five M1 metal lines to connect two adjacent M1 metal lines, according to one or more other embodiments. Further, the bridge metal pattern may be formed to connect two adjacent M2 metal lines in an M2 metal layer above the M1 metal layer, or a different metal layer, according to one or more other embodiments.

Figure 9:
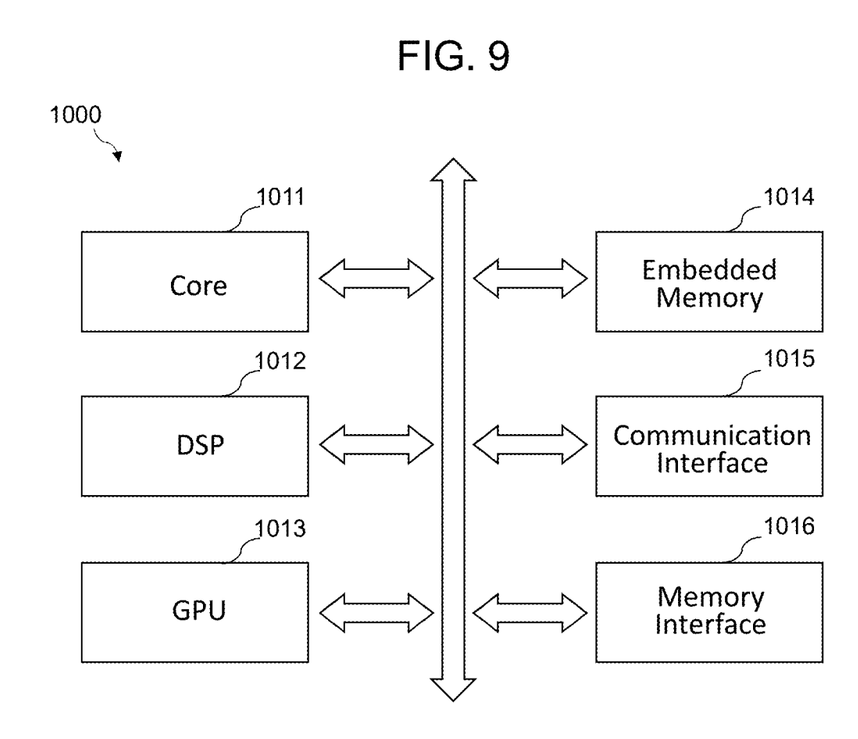
FIG. 9 is a block diagram of a system-on-chip (SoC) 1000 including at least one of the semiconductor device shown in FIGS. 4A-4B and FIG. 5F and the semiconductor device shown in FIGS. 6H and 7D, according to one or more embodiments.

FIG. 9 is a block diagram of a system-on-chip (SoC) 1000 including at least one of the semiconductor devices shown in FIGS. 4A-4B and FIGS. 6A-6B, according to one or more embodiments.

Referring to FIG. 9, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data for use by the core 1011, the DSP 1012, and the GPU 1013. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include at least one of the semiconductor devices shown in FIGS. 4A-4B and FIGS. 6A-6B, according to one or more embodiments.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:
a base layer;
a $1^{st}$ metal line, a $2^{nd}$ metal line, and a $3^{rd}$ metal line which are extended in a $1^{st}$ direction and arranged in a $2^{nd}$ direction, intersecting the $1^{st}$ direction, in a $1^{st}$ layer above the base layer, the $1^{st}$ metal line being adjacent to the $2^{nd}$ metal line;
a via on the $3^{rd}$ metal line in a $2^{nd}$ layer immediately above the $1^{st}$ layer; and
a bridge metal pattern connecting the $1^{st}$ metal line and the $2^{nd}$ metal line in the $2^{nd}$ layer.

2. The semiconductor device of claim 1, wherein a top surface of the bridge metal pattern is at a level lower than a top surface of the via.

3. The semiconductor device of claim 1, a bottom surface of the bridge metal pattern contacts top surfaces of the $1^{st}$ metal line and the 2nd metal line.

4. The semiconductor device of claim 1, wherein the $1^{st}$ layer comprises a $1^{st}$ isolation structure, and the $2^{nd}$ layer comprises a $2^{nd}$ isolation structure, and wherein the bridge metal pattern is in a lower portion of the 2nd isolation structure, and the via is in an upper portion of the 2nd isolation structure above the lower portion in a $3^{rd}$ direction intersecting the 1st direction and the 2nd direction.

5. The semiconductor device of claim 4, wherein a connection surface is formed between the lower portion and upper portion of the 2nd isolation structure.

6. The semiconductor device of claim 1, wherein the bridge metal pattern is extended in the $2^{nd}$ direction to connect the $1^{st}$ metal line and the $2^{nd}$ metal line.

7. The semiconductor device of claim 6, wherein the bridge metal pattern has a smaller length than the $1^{st}$ metal line or the $2^{nd}$ metal line in the 1st direction.

8. The semiconductor device of claim 1, wherein the bridge metal pattern comprises a portion between an upper side surface of the $1^{st}$ metal line and an upper side surface of the $2^{nd}$ metal line facing each other.

9. The semiconductor device of claim 8, wherein the portion of the bridge metal pattern connects the upper side surfaces of the $1^{st}$ metal line and the $2^{nd}$ metal line.

10. The semiconductor device of claim 8, wherein a bottom surface of the portion of the bridge metal pattern is at a level above a bottom surface of the $1^{st}$ metal line or the $2^{nd}$ metal line.

11. The semiconductor device of claim 1, wherein the $1^{st}$ metal line and the $2^{nd}$ metal line have a different material composition than the bridge metal pattern.

12. The semiconductor device of claim 11, wherein the $1^{st}$ metal line and the $2^{nd}$ metal line comprises ruthenium (Ru) and the bridge metal pattern comprises at least one of copper (Cu), tungsten (W), aluminum (Al), and cobalt (Co).

13. A semiconductor device comprising: a base layer; a $1^{st}$ metal line and a $2^{nd}$ metal extended in a $1^{st}$ direction and arranged in a $2^{nd}$ direction, intersecting the $1^{st}$ direction, in a $1^{st}$ layer above the base layer; and a bridge metal pattern extended in the $2^{nd}$ direction to connect the $1^{st}$ metal line and the $2^{nd}$ metal line in a $2^{nd}$ layer immediately above the $1^{st}$ layer.

14. The semiconductor device of claim 13, wherein a bottom surface of the bridge metal pattern is at a level on or above a top surface of the $1^{st}$ metal line or the $2^{nd}$ metal line.

15. The semiconductor device of claim 13, wherein a bottom surface of the bridge metal pattern is at a level below a top surface of the 1st metal line or the 2nd metal line.

16. A method of manufacturing a semiconductor device, the method comprising: providing a base layer; forming a $1^{st}$ metal line and a $2^{nd}$ metal line to be extended in a $1^{st}$ direction and arranged in a $2^{nd}$ direction, intersecting the $1^{st}$ direction, in a $1^{st}$ layer above the base layer; and forming a bridge metal pattern to be extended in the $2^{nd}$ direction and connect the $1^{st}$ metal line and the $2^{nd}$ metal line in a $2^{nd}$ layer immediately above the $1^{st}$ layer.

17. The method of claim 16, further comprising: forming a $3^{rd}$ metal line extended in the $1^{st}$ direction in the $1^{st}$ layer; and forming a via on the $3^{rd}$ metal line in the $2^{nd}$ layer, wherein a top surface of the bridge metal pattern is at a level lower than a top surface of the via.

18. The method of claim 16, wherein the $1^{st}$ metal line and the $2^{nd}$ metal line have a different material composition than the bridge metal pattern.

19. The method of claim 16, wherein the bridge metal pattern is formed such that the bridge metal pattern contacts top surface of the $1^{st}$ metal line and the $2^{nd}$ metal line.

20. The method of claim 19, wherein the bridge metal pattern is formed such that a portion of the bridge metal pattern contacts upper side surfaces of the $1^{st}$ metal line and the $2^{nd}$ metal line facing each other in the $2^{nd}$ direction.

* * * * *